(12) United States Patent
Aritome

(10) Patent No.: US 7,263,006 B2
(45) Date of Patent: Aug. 28, 2007

(54) MEMORY BLOCK ERASING IN A FLASH MEMORY DEVICE

(75) Inventor: Seiichi Aritome, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 25 days.

(21) Appl. No.: 11/340,093

(22) Filed: Jan. 26, 2006

(65) Prior Publication Data

US 2007/0171729 A1    Jul. 26, 2007

(51) Int. Cl.
*G11C 16/04* (2006.01)
(52) U.S. Cl. .................... 365/185.29; 365/185.22; 365/185.33
(58) Field of Classification Search .......... 365/185.33, 365/185.22, 185.29, 185.24, 185.111, 185.25
See application file for complete search history.

(56) References Cited

U.S. PATENT DOCUMENTS

| 5,526,309 | A | 6/1996 | Jinbo |
| 5,590,074 | A | 12/1996 | Akaogi et al. |
| 6,052,310 | A | 4/2000 | Sunkavalli |
| 6,141,250 | A | 10/2000 | Kashimura |
| 6,172,914 | B1 | 1/2001 | Haddad et al. |
| 6,304,486 | B1 | 10/2001 | Yano |
| 6,356,480 | B1 | 3/2002 | Sakakibara et al. |
| 6,466,484 | B1 | 10/2002 | Sakakibara et al. |
| 6,914,827 | B2 * | 7/2005 | Choi ............ 365/185.29 |
| 2005/0232022 | A1 * | 10/2005 | Choi ............ 365/185.29 |

* cited by examiner

*Primary Examiner*—Son Dinh
*Assistant Examiner*—Hien N Nguyen
(74) *Attorney, Agent, or Firm*—Leffert Jay & Polglaze, P.A.

(57) ABSTRACT

The flash memory cell erase operation performs an erase operation at a first erase voltage for a first erase time. An erase verify read operation is then performed for an increasing sensing time period until either all of the memory cells of the block have a threshold voltage that is equal to or greater than an erased threshold voltage or a predetermined quantity of erase verify operations have been performed. The sensing time period for each subsequent verify operation is increased until a maximum sense time is reached. When the memory cells have all been erased, the erase voltage and erase time corresponding to the sensing time period at which the cells passed is used for further erase operations on the memory block.

22 Claims, 8 Drawing Sheets

MEMORY BLOCK ERASING IN A FLASH MEMORY DEVICE

TECHNICAL FIELD OF THE INVENTION

The present invention relates generally to memory devices and in particular the present invention relates to erasing flash memory devices.

BACKGROUND OF THE INVENTION

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), and flash memory.

A flash memory is a type of memory that can be erased and reprogrammed in blocks instead of one byte at a time. A typical flash memory comprises a memory array, which includes a large number of memory cells. Each of the memory cells includes a floating gate field-effect transistor capable of holding a charge. The cells are usually grouped into blocks. Each of the cells within a block can be electrically programmed in a random basis by charging the floating gate. The data in a cell is determined by the presence or absence of the charge in the floating gate. The charge can be removed from the floating gate by a block erase operation.

A typical prior art block erase operation first pre-programs the memory block before an erase operation is performed. The pre-programming reduces the chances of the cells going into a depletion mode. As the cells in a flash memory device get erased, they may get erased to the point where they go into depletion and conduct current even when those cells have a gate voltage of 0 V. This affects the reading of all other cells in their respective columns. By pre-programming the memory, the cells start from a known, programmed state and are therefore less likely to go into an overerased depletion state.

The memory block is then erased. The erase operation is conducted to erase the cells to at least a minimum voltage level. The drain and source connections of the bit lines are all typically left floating as are the select gate drain transistors and the select gate source transistors. The word lines of the block to be erased are at ground potential.

An erase verify read is then performed to determine the success of the erase operation on each cell of the memory block. One such erase verify operation comprises, at least in part, comparing each cell's erase current to a sense amplifier reference current level. During this operation, all of the word lines of the block are held at one predetermined voltage (e.g., 0 V) while the selected bit lines are biased at another voltage (e.g., $V_{CC}$). A pulse at a predetermined level (e.g., 0 V) is applied to the unselected bit lines. The select gate drain and source transistors are typically at 4.5 V that is typically referred to in the art as $V_{pass}$. If the verify operation fails, the erase operation is performed again. If the erase verify passes, the erase operation has been successfully completed.

If a column of cells has only one unerased cell after an erase verify, the prior art erase operation applies additional erase pulses to the entire column. This can overstress memory cells in the column that are already erased and do not require additional erase pulses. The overstressing of the cells can increase their failure rate.

For the reasons stated above, and for other reasons stated below which will become apparent to those skilled in the art upon reading and understanding the present specification, there is a need in the art for an erase algorithm that reduces the overstressing of memory cells in a flash memory device.

SUMMARY

The above-mentioned problems with erasing a non-volatile memory device and other problems are addressed by the present invention and will be understood by reading and studying the following specification.

The present invention encompasses a method for erasing a block of memory in a flash memory device. The block of memory has a plurality of memory cells that are organized in columns and rows. The method comprises performing an erase operation on a subset of memory cells of the plurality of memory cells. The erase operation is performed at a first erase voltage for a first erase time. An erase verify operation is the performed on the subset of memory cells until the subset of memory cells is either erased or fails. A first erase verify operation starts at a first sensing time period that increases for each subsequent erase verify operation. If the erase verify operation passes at a final sensing time period, a final erase voltage and a final erase time are determined in response to the final sensing time period. Further embodiments of the invention include methods and apparatus of varying scope.

DETAILED DESCRIPTION

Figure 1:
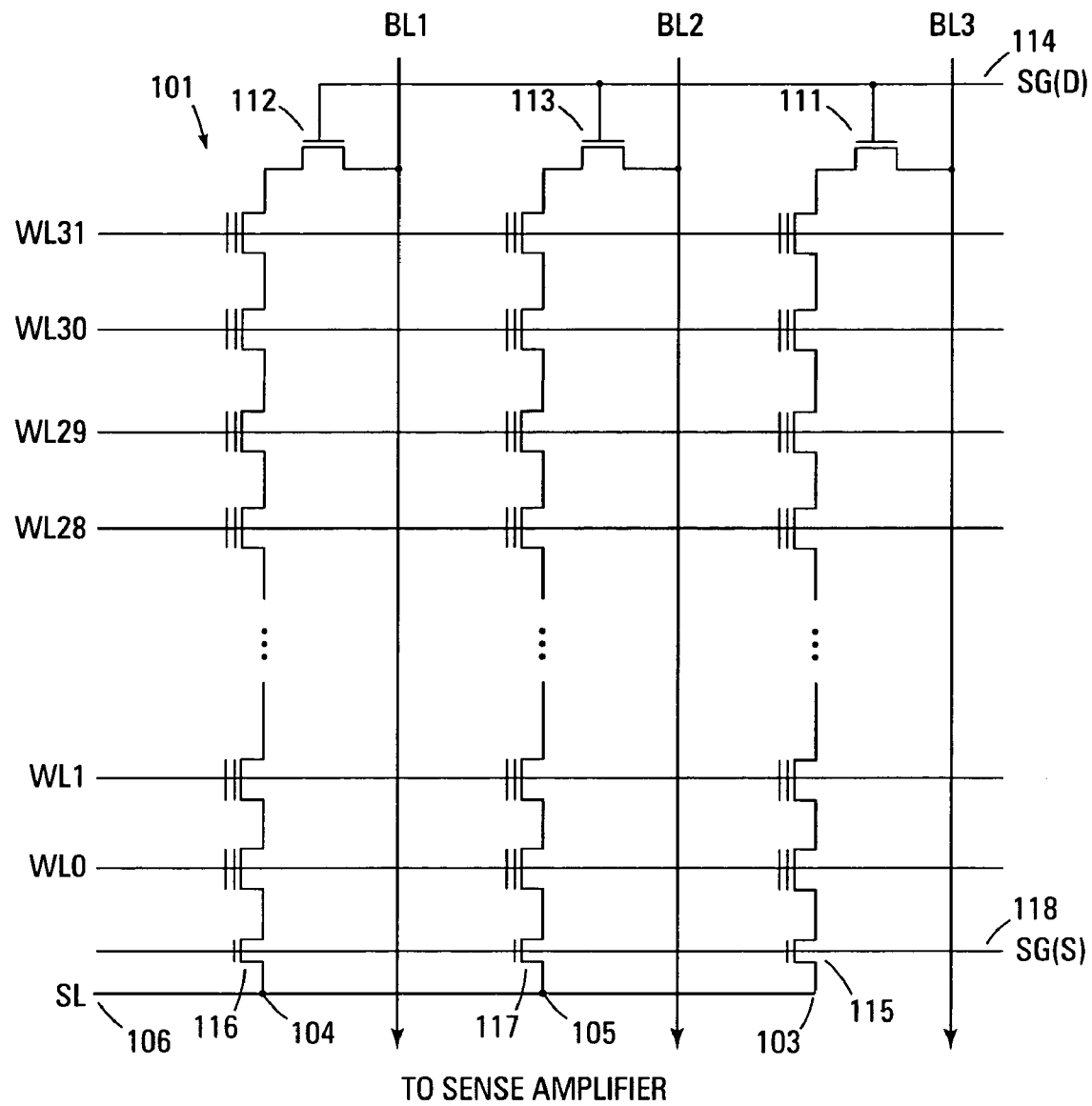
FIG. 1 shows a simplified diagram of a flash memory array of the present invention.

In the following detailed description of the invention, reference is made to the accompanying drawings that form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The following detailed description is, therefore, not to be taken in a limiting sense, and the scope of the present invention is defined only by the appended claims and equivalents thereof.

FIG. 1 illustrates a simplified schematic diagram of one embodiment for a NAND flash memory array of the present invention. The memory array of FIG. 1, for purposes of clarity, does not show all of the elements typically required in a memory array. For example, only three bit lines are shown (BL1, BL2, and BL3) when the number of bit lines required actually depends upon the memory density. The bit lines are subsequently referred to as (BL1-BLN).

The array is comprised of an array of floating gate cells 101 arranged in series columns 103, 104, 105. Each of the floating gate cells 101 is coupled drain-to-source in each series chain 103, 104, 105. A word line (WL0-WL31) that spans across multiple series strings 103, 104, 105 is coupled to the control gates of every floating gate cell in a row in order to control their operation. The bit lines (BL1-BLN) are eventually coupled to sense amplifiers that detect the state of each cell. The sense amplifier is shown and discussed subsequently with reference to the memory system of FIG. 5.

In operation, the word lines (WL0-WL31) select the individual floating gate memory cells in the series chain 103, 104, 105 to be written to or read from and operate the remaining floating gate memory cells in each series string 103, 104, 105 in a pass through mode. Each series string 103, 104, 105 of floating gate memory cells is coupled to a source line 106 by a source select gate 115, 116, 117 and to an individual bit line (BL1-BLN) by a drain select gate 111, 112, 113. The source select gates 115, 116, 117 are controlled by a source select gate control line SG(S) 118 coupled to their control gates. The drain select gates 111, 112, 113 are controlled by a drain select gate control line SG(D) 114.

Each cell can be programmed as a single bit per cell (i.e., single level cell—SLC) or multiple bits per cell (i.e., multilevel cell—MLC). Each cell's threshold voltage ($V_t$) determines the data that is stored in the cell. For example, in a single bit per cell, a $V_t$ of 0.5 V might indicate a programmed cell while a $V_t$ of −0.5 V might indicate an erased cell. The multilevel cell may have multiple $V_t$ windows that each indicate a different state. Multilevel cells take advantage of the analog nature of a traditional flash cell by assigning a bit pattern to a specific voltage range stored on the cell. This technology permits the storage of two or more bits per cell, depending on the quantity of voltage ranges assigned to the cell.

A memory array of the present invention is broken down into memory blocks. The quantity of memory blocks is typically determined by the size of the memory device (e.g., 512 MB, 1 GB). In one embodiment, each memory block is comprised of 64 pages.

In the embodiments of the present invention illustrated in FIGS. 2-4 and discussed subsequently, the voltages and times expressed for $V_{erase}$, $V_t$, $t_{erase}$, and $t_{rsad}$, as well as any other times and voltages, are for purposes of illustration only. The present invention is not limited to any certain values.

Figure 2:
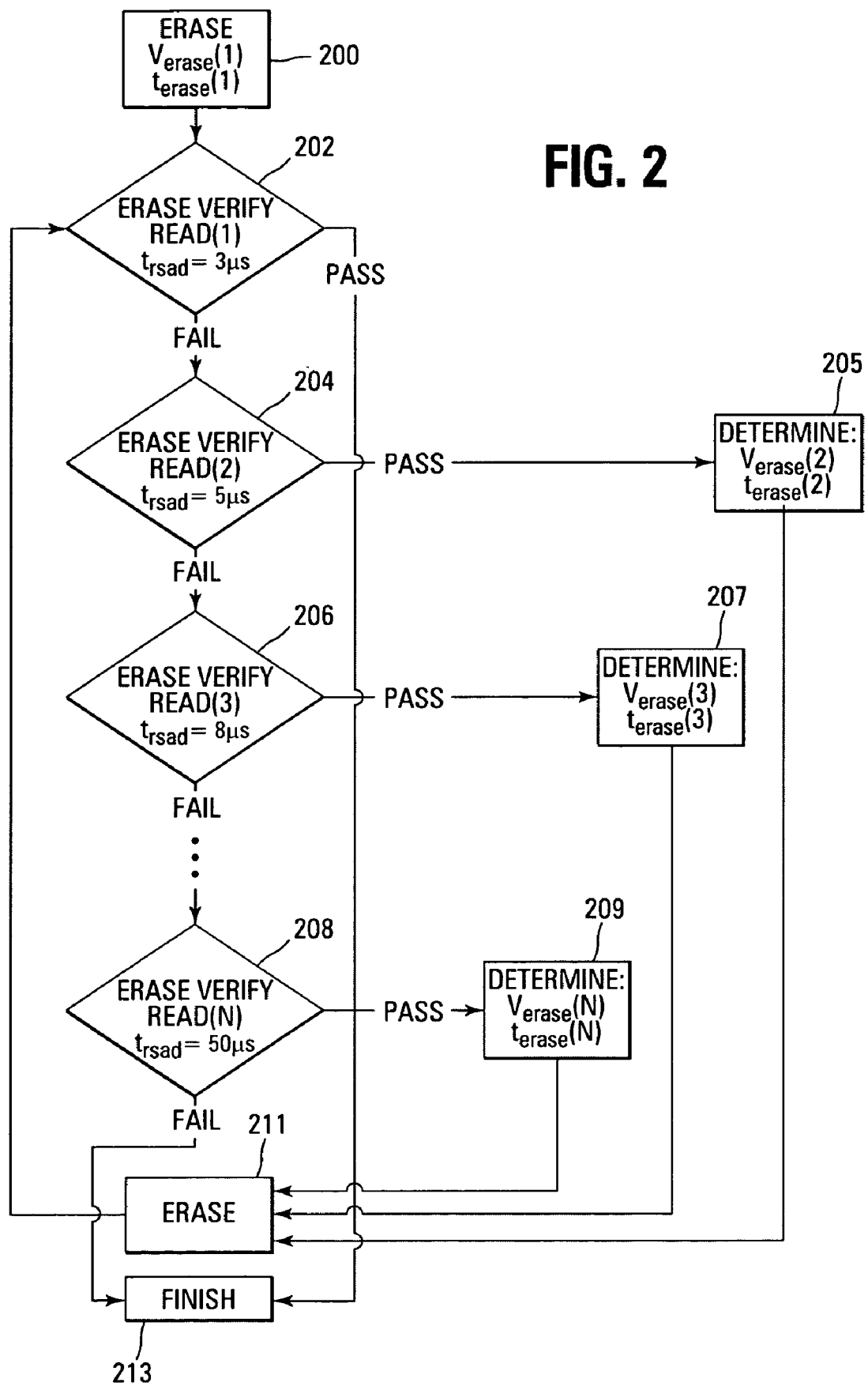
FIG. 2 shows a flowchart of one embodiment of an erase operation of the present invention.

FIG. 2 illustrates a flowchart of one embodiment of the erase operation of the present invention. The method begins with an erase operation 200 in which the array tub (or array well) bias ($V_{erase}(1)$) is applied to the cell for a time period of $t_{erase}(1)$. In one embodiment, $V_{erase}(1)$ is approximately 19 V and $t_{erase}(1)$ is approximately 1.0 ms.

An erase verify operation is then performed 202. In the illustrated embodiment, the erase verify read 1 operation 202 is performed with a sensing time, $t_{rsad}$, of 3 µs. If the erase verify read 1 operation was successful such that all of the memory block cells have been erased, the operation is finished 213.

In one embodiment, the sense time of 3 µs detects a resulting threshold voltage, $V_t$, of −1.5 V. Therefore, if a cell under test has a $V_t$ of less than −1.5 V, the erase verify read (1) operation has passed. If the cell has a $V_t$ of greater than −1.5 V, the erase verify read (1) operation has failed. Alternate embodiments have different threshold voltages for the initial sensing time.

If any of the memory cells of the block are still not erased, the method performs another erase verify operation with a longer sense time 204 that results in detecting a higher threshold voltage. In the illustrated embodiment, the erase verify read (2) operation is performed with a $t_{rsad}$=5 µs resulting in a detected $V_t$ of −1.2 V.

If this operation 204 passes, the method determines the $V_{erase}(2)$ and $t_{erase}(2)$ values that would result in a threshold voltage of −1.2 V. In one embodiment, this is accomplished by a look-up table that maps an erase voltage and time period to a specific $V_t$. These values for $V_{erase}(2)$ and $t_{erase}(2)$ are then used in an erase operation 211. The erase verify read (1) operation 202 with the shortest $t_{rsad}$ time is again performed to verify proper erase voltage levels. In one embodiment, $V_{erase}(2)$ is 19.3 V and $t_{erase}(2)$ is 1 ms.

If the erase verify read (2) operation 204 failed, another erase verify operation 206 is performed with a still longer sense time. In the illustrated embodiment, sensing time $t_{rsad}$=8 µs is used that would detect a threshold voltage of −0.8 V. Any of the cells having a $V_t$ greater than this voltage have not been fully erased and therefore have failed.

If any of the cells being read have a $V_t$ less than this voltage, they have been successfully erased and therefore passed. As in previous levels, the look-up table is used to determine the $V_{erase}(3)$ and $t_{erase}(3)$ necessary to generate a $V_t$ of −0.8 V. In one embodiment, $V_{erase}(3)$ is 19.7 V and $t_{erase}(3)$ is 1 ms.

The erase verify read operations repeat N times 208 until either a cell or cells have failed and the method is finished 213 or the cell(s) eventually pass on the $N^{th}$ time. By the $N^{th}$ time, $t_{rsad}$ has increased to a maximum sensing time and a maximum passing threshold voltage. In one embodiment, this time is 50 µs and the maximum threshold voltage is −0.5 V. If the cell(s) have passed by the $N^{th}$ time through, the $V_{erase}(N)$ and $t_{erase}(N)$ are determined 209, an erase operation 211 performed at the $V_{erase}(N)$ voltage and $t_{erase}(N)$ time, and the block verified. For example, in one embodiment $V_{erase}(N)$ is 20 V and $t_{erase}(N)$ is 1 ms.

Figure 3:
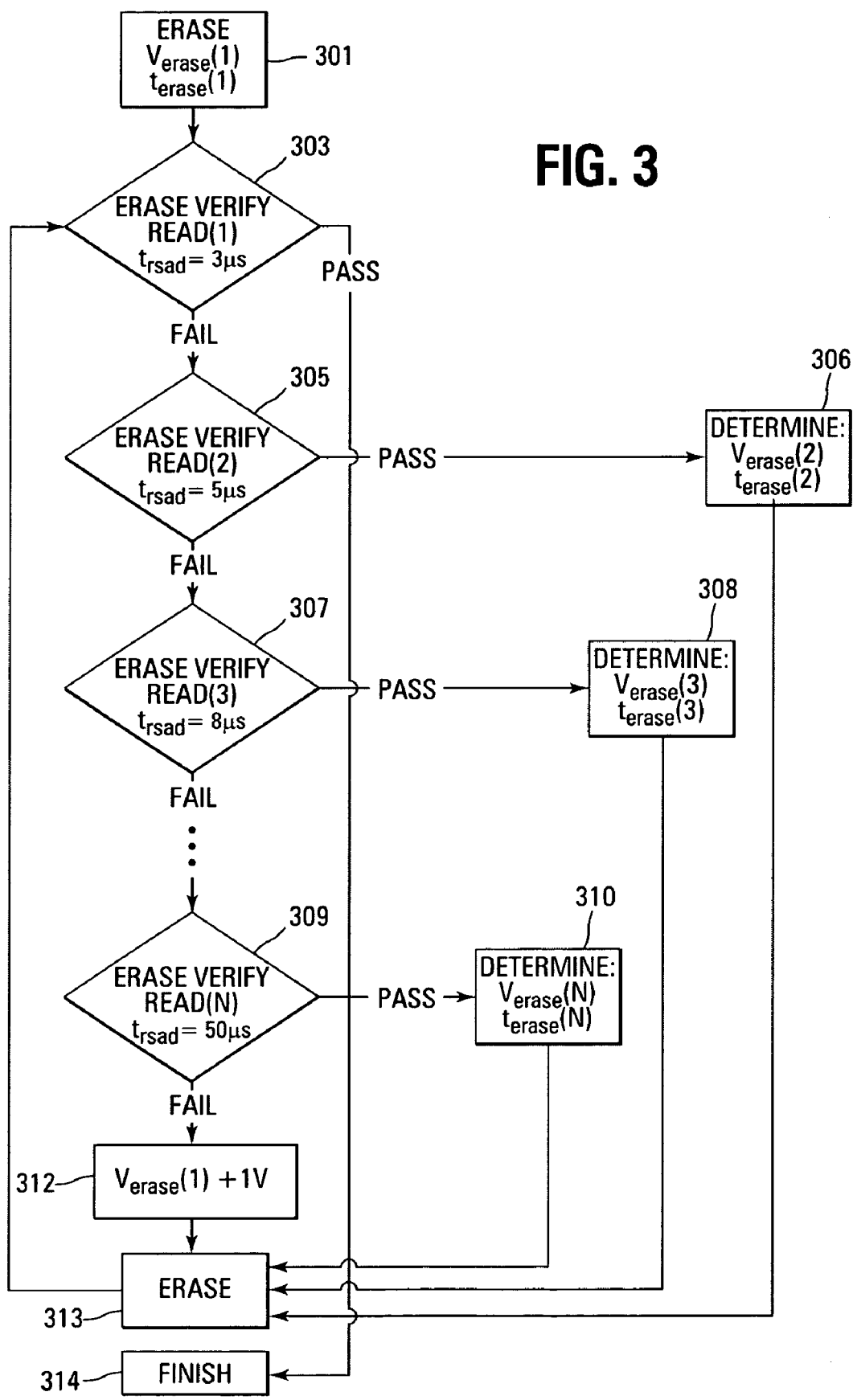
FIG. 3 shows a flowchart of an alternate embodiment of the erase operation of the present invention.

FIG. 3 illustrates an alternate embodiment for the erase method of the present invention. This embodiment performs a substantially similar method as in FIG. 2 but changes the initial erase voltage if a cell or cells eventually fail.

The method of FIG. 3 begins with an erase operation 301 in which the array tub bias ($V_{erase}(1)$) is applied to the cell tub or well for a predetermined time period of $t_{erase}(1)$. In one embodiment, $V_{erase}(1)$ is approximately 19 V and $t_{erase}(1)$ is approximately 1.0 ms. Alternate embodiments use different initial voltages and times.

An erase verify operation is then performed 303. In the illustrated embodiment, the erase verify read (1) operation 303 is performed with a sensing time, $t_{rsad}$, of 3 µs. If the erase verify read (1) operation was successful such that all of the memory block cells have been erased, the operation is finished 314.

In one embodiment, the sense time of 3 µs detects a resulting threshold voltage, $V_t$, of −1.5 V. Therefore, if a cell under test has a $V_t$ of less than −1.5 V, the erase verify read (1) operation has passed. If the cell has a $V_t$ of greater than −1.5 V, the erase verify read (1) operation has failed. Alternate embodiments have different threshold voltages for the initial sensing time.

If any of the memory cells of the block are still not erased, the method performs another erase verify operation with a longer sense time 305 that results in detecting a higher threshold voltage. In the illustrated embodiment, the erase verify read (2) operation 305 is performed with a $t_{rsad}$=5 µs resulting in a detected $V_t$ of −1.2 V.

If this operation 305 passes, the method determines the $V_{erase}$(2) and $t_{erase}$(2) values that would result in a threshold voltage of −1.2 V. In one embodiment, this is accomplished by a look-up table that maps an erase voltage and time period to a specific $V_t$. These values for $V_{erase}$(2) and $t_{erase}$(2) are then used in an erase operation 313. The erase verify read (1) operation 303 with the shortest $t_{rsad}$ time is again performed to verify proper erase voltage levels and the method is finished 314.

If the erase verify read (2) operation 305 failed, another erase verify operation 307 is performed with a still longer sense time. In the illustrated embodiment, sensing time $t_{rsad}$=8 µs is used that would detect a threshold voltage of −0.8 V. Any of the cells having a $V_t$ greater than this voltage have not been fully erased and therefore have failed.

If any of the cells being read have a $V_t$ less than this voltage, they have been successfully erased and therefore passed. As in previous levels, the look-up table is used to determine the $V_{erase}$(3) and $t_{erase}$(3) necessary to generate a $V_t$ of −0.8 V. Alternate embodiments may use an algorithm to determine $V_{erase}$(N) and $t_{erase}$(N) from the desired threshold voltage.

The erase verify read operations repeat N times 309 until either a cell or cells have failed or the cell(s) eventually pass on the $N^{th}$ time. In which case, the $V_{erase}$(N) and $t_{erase}$(N) are determined 310, an erase operation 313 performed at the $V_{erase}$(N) voltage and $t_{erase}$(N) time, and the block verified.

In this embodiment, if the method has been repeated N times and at least one cell has still not been successfully erased, the initial erase voltage, $V_{erase}$(1), is increased, an erase operation 313 is performed, and the method repeated. In the illustrated embodiment, the initial erase voltage, $V_{erase}$(1), is increased by 1.0 V for example. Alternate embodiments can use other voltage increases.

Figure 4:
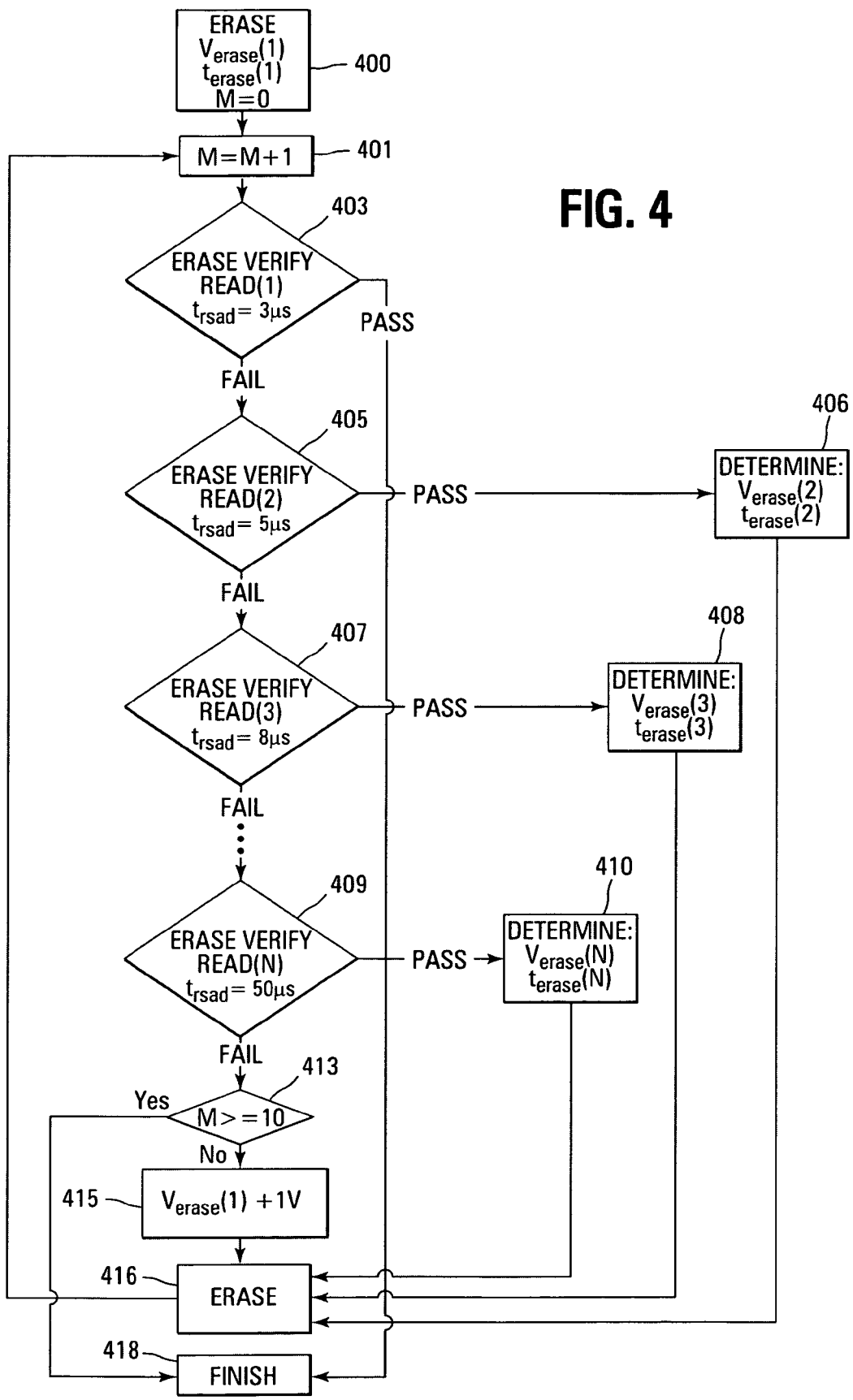
FIG. 4 shows a flowchart of another alternate embodiment of the erase operation of the present invention.

FIG. 4 illustrates yet another embodiment for the erase method of the present invention. This embodiment performs a substantially similar method as illustrated in FIG. 3 but limits the number of times that the method is repeated.

The method of FIG. 4 begins with an erase operation 400 in which the gate bias ($V_{erase}$(1)) is applied to the cell gates for a predetermined time period of $t_{erase}$(1). In one embodiment, $V_{erase}$(1) is approximately 19 V and $t_{erase}$(1) is approximately 1.0 ms. Alternate embodiments use different initial voltages and times. A counter M is also initialized to zero at this point. The counter is then incremented 401.

An erase verify operation is then performed 403. In the illustrated embodiment, the erase verify read (1) operation 403 is performed with a sensing time, $t_{rsad}$, of 3 µs. If the erase verify read (1) operation was successful such that all of the memory block cells have been erased, the operation is finished 418.

In one embodiment, the sense time of 3 µs detects a resulting threshold voltage, $V_t$, of −1.5 V. Therefore, if a cell under test has a $V_t$ of less than −1.5 V, the erase verify read (1) operation has passed. If the cell has a $V_t$ of greater than −1.5 V, the erase verify read (1) operation has failed. Alternate embodiments have different threshold voltages for the initial sensing time.

If any of the memory cells of the block are still not erased, the method performs another erase verify operation with a longer sense time 405 that results in detecting a higher threshold voltage. In the illustrated embodiment, the erase verify read (2) operation 405 is performed with a $t_{rsad}$=5 µs resulting in a detected $V_t$ of −1.2 V.

If this operation 405 passes, the method determines the $V_{erase}$(2) and $t_{erase}$(2) values that would result in a threshold voltage of −1.2 V. In one embodiment, this is accomplished by a look-up table that maps an erase voltage and time period to a specific $V_t$. These values for $V_{erase}$(2) and $t_{erase}$(2) are then used in an erase operation 416. M is incremented 401 and the erase verify read (1) operation 403 with the shortest $t_{rsad}$ time is again performed to verify proper erase voltage levels and the method is finished 418 if the verify is successful.

If the erase verify read (2) operation 405 failed, another erase verify operation 407 is performed with a still longer sense time. In the illustrated embodiment, sensing time $t_{rsad}$=8 µs is used that would detect a threshold voltage of −0.8 V. Any of the cells having a $V_t$ greater than this voltage have not been fully erased and therefore have failed.

If any of the cells being read have a $V_t$ less than this voltage, they have been successfully erased and therefore passed. As in previous levels, the look-up table is used to determine the $V_{erase}$(3) and $t_{erase}$(3) necessary to generate a $V_t$ of −0.8 V. Alternate embodiments may use an algorithm to determine $V_{erase}$(N) and $t_{erase}$(N) from the desired threshold voltage.

The erase verify read operations repeat M times 409 until all of the cells have either eventually passed or a predetermined threshold of repeat operations 413 has been reached. In one embodiment, if M≧10 413, the cell or cells have failed and the method has finished 418. Alternate embodiments can repeat the method for a different number of times.

If the cells have successfully been erased prior to M reaching the predetermined threshold, the $V_{erase}$(N) and $t_{erase}$(N) are determined 410, an erase operation 416 performed at the $V_{erase}$(N) voltage and $t_{erase}$(N) time, M is incremented 401, and the block verified 403 again.

In this embodiment, if the method has been repeated M times and at least one cell has still not been successfully erased, the initial erase voltage, $V_{erase}$(1), is increased 415, an erase operation 416 is performed, and the method repeated. In the illustrated embodiment, $V_{erase}$(1) is increased by 1.0 V. Alternate embodiments can use other voltage increases.

Figure 7:
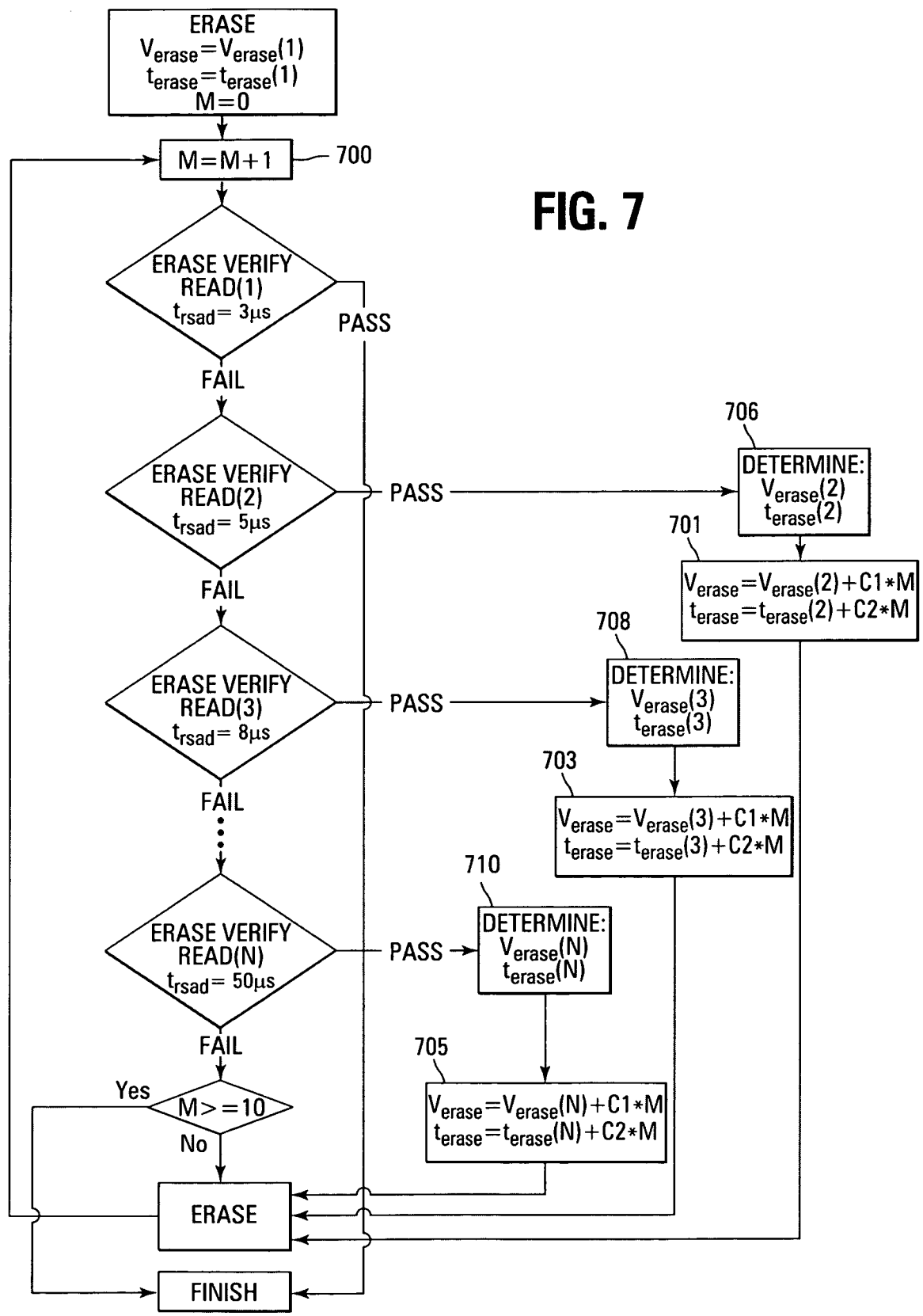
FIG. 7 shows a flowchart of yet another embodiment of the erase operation of the present invention.

FIG. 7 illustrates yet another embodiment of the erase method of the present invention. This embodiment is substantially the same as the embodiment illustrated in FIG. 4 and described previously. However, this embodiment increases $V_{erase}$ and $t_{erase}$ by constants C1 and C2, respectively, for each pass through the loop.

The first time through the method, M is set to one 700. Therefore, after $V_{erase}$(2) and $t_{erase}$(2) are determined 706 as discussed previously with reference to FIG. 4, $V_{erase}$, is set to $V_{erase}$(2) increased by constant C1*M and $t_{erase}$ is set to $t_{erase}$(2) increased by constant C2*M. C1 and C2 can be any constant that is determined by experimentation to provide the best increase in their respective erase voltage and erase time.

The addition of a loop constant that increases 700 for each pass through loop of FIG. 7 is repeated for each M erase verify read operation. This is illustrated in steps 708, 703 for the second pass through the loop and 710, 705 for the $M^{th}$ pass through the erase method loop.

Figure 8:
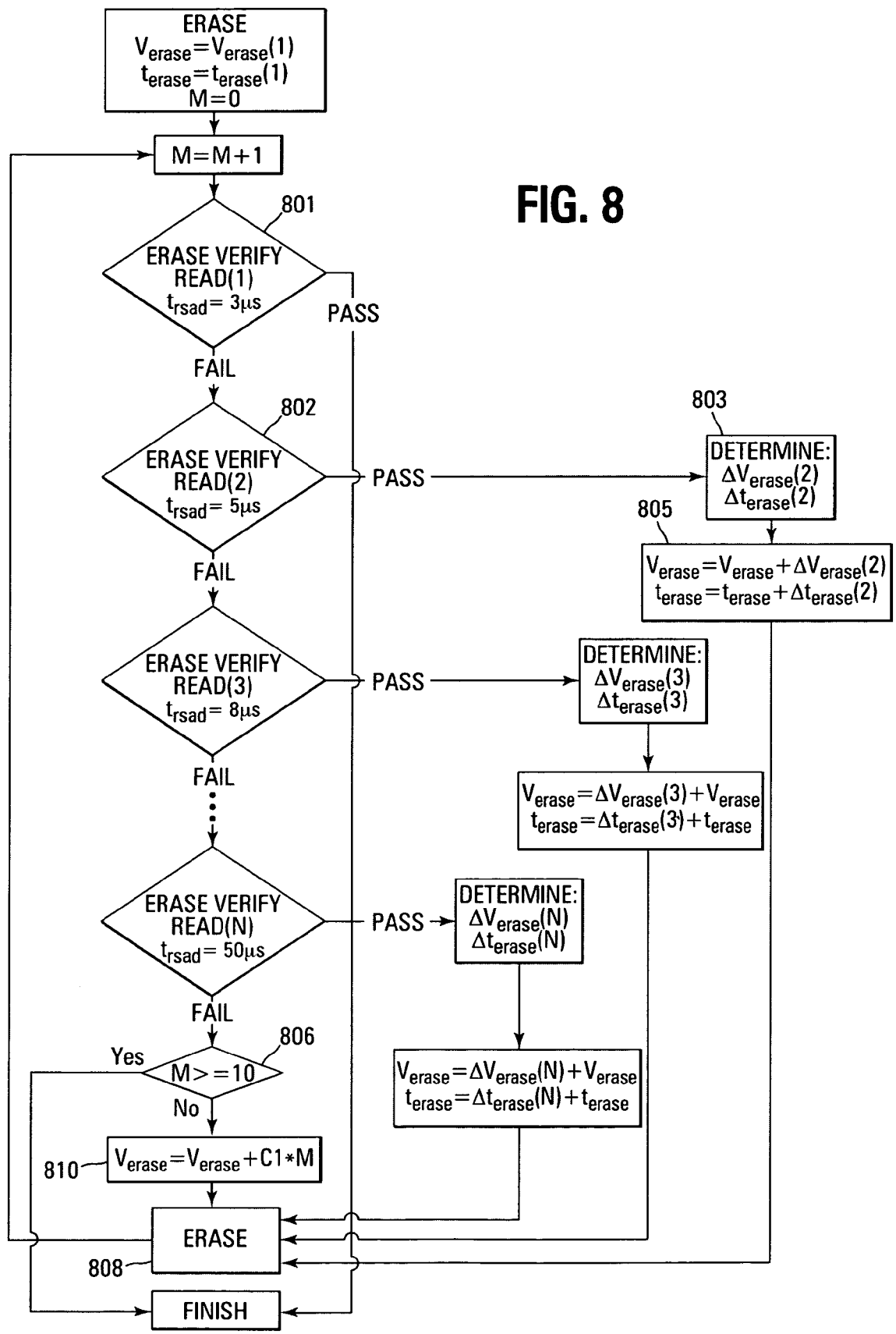
FIG. 8 shows a flowchart of still another embodiment of the erase operation of the present invention.

FIG. 8 illustrates still another embodiment of the erase method of the present invention. This embodiment is similar to the embodiment illustrated in FIG. 7.

The main differences between the embodiment of FIG. 8 and the embodiment of FIG. 7 is that after an Erase Verify Read(N) operation has passed, a $\Delta V_{erase}$(N) voltage and a $\Delta t_{erase}$(N) time are determined. The delta values are used in place of the constants C1 and C2 of the previous embodiments. The delta values are also determined in a substantially similar was as previous embodiments such as experimentation, a look-up table, and algorithms. In one embodiment, as N increases, the delta value increases.

If the Erase Verify Read(1) 801 operation fails, the Erase Verify Read(2) 802 operation with the 5 μs $t_{rsad}$ is performed. If this operation passes, $\Delta V_{erase}(2)$ and $\Delta t_{erase}(2)$ are found, as discussed previously (i.e., look-up table, experimentation). New erase voltage, $V_{erase}$, and erase time, $t_{erase}$, are then determined by adding 805 the $\Delta V_{erase}(2)$ voltage to the original erase voltage, $V_{erase}$, and the $\Delta t_{erase}(2)$ time to the original erase time, $t_{erase}$. The erase operation 808 is then performed with these values. This is repeated for the Erase Verify Read (N) operations.

If the N Erase Verify Read operations have been attempted M times 806 that, in one embodiment, is 10 times, the erase voltage is determined to be $V_{erase}=V_{erase}+C1*M$ 810 where C1 is a constant value.

The embodiments of the erase method present invention can be performed for each erase operation or performed only for the first erase operation. If the embodiments are performed only for the first erase operation, the final erase voltage and final erase time are then used for all future erase operations. This has the benefit of speeding up future erase operations.

Figure 5:
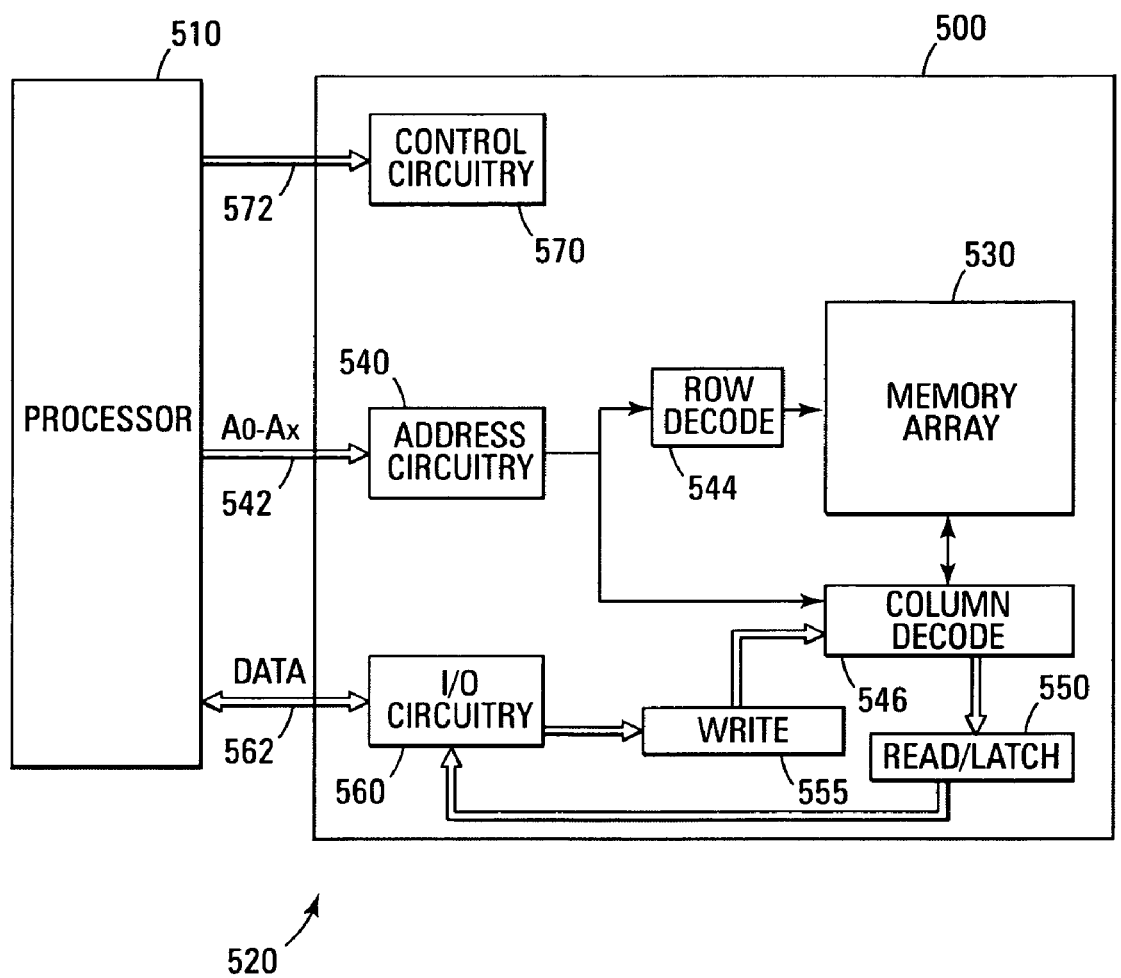
FIG. 5 shows a block diagram of one embodiment of a memory system of the present invention.

FIG. 5 illustrates a functional block diagram of a memory device 500 of one embodiment of the present invention that is coupled to a processor 510. The processor 510 may be a microprocessor, a processor, or some other type of controlling circuitry. The memory device 500 and the processor 510 form part of a memory system 520. The memory device 500 has been simplified to focus on features of the memory that are helpful in understanding the present invention.

The memory device includes an array of memory cells 530. In one embodiment, the memory cells are non-volatile floating gate memory cells and the memory array 530 is arranged in banks of rows and columns.

An address buffer circuit 540 is provided to latch address signals provided on address input connections A0-Ax 542. Address signals are received and decoded by a row decoder 544 and a column decoder 546 to access the memory array 530. It will be appreciated by those skilled in the art, with the benefit of the present description, that the number of address input connections depends on the density and architecture of the memory array 530. That is, the number of addresses increases with both increased memory cell counts and increased bank and block counts.

The above-described embodiments have focused on a NAND architecture memory array. However, the present invention is not limited to this architecture. The embodiments of the memory block erase method of the present invention can be used in any architecture of memory device (e.g., NAND, NOR, AND).

The memory device 500 reads data in the memory array 530 by sensing voltage or current changes in the memory array columns using sense/latch circuitry 550. The sense/latch circuitry, in one embodiment, is coupled to read and latch a row of data from the memory array 530. Data input and output buffer circuitry 560 is included for bi-directional data communication over a plurality of data connections 562 with the controller 510). Write circuitry 555 is provided to write data to the memory array.

Control circuitry 570 decodes signals provided on control connections 572 from the processor 510. These signals are used to control the operations on the memory array 530, including data read, data write, and erase operations. In one embodiment, the control circuitry 570 executes the erase methods of the present invention. The control circuitry 570 may be a state machine, a sequencer, or some other type of controller.

The flash memory device illustrated in FIG. 5 has been simplified to facilitate a basic understanding of the features of the memory. A more detailed understanding of internal circuitry and functions of flash memories are known to those skilled in the art.

Figure 6:
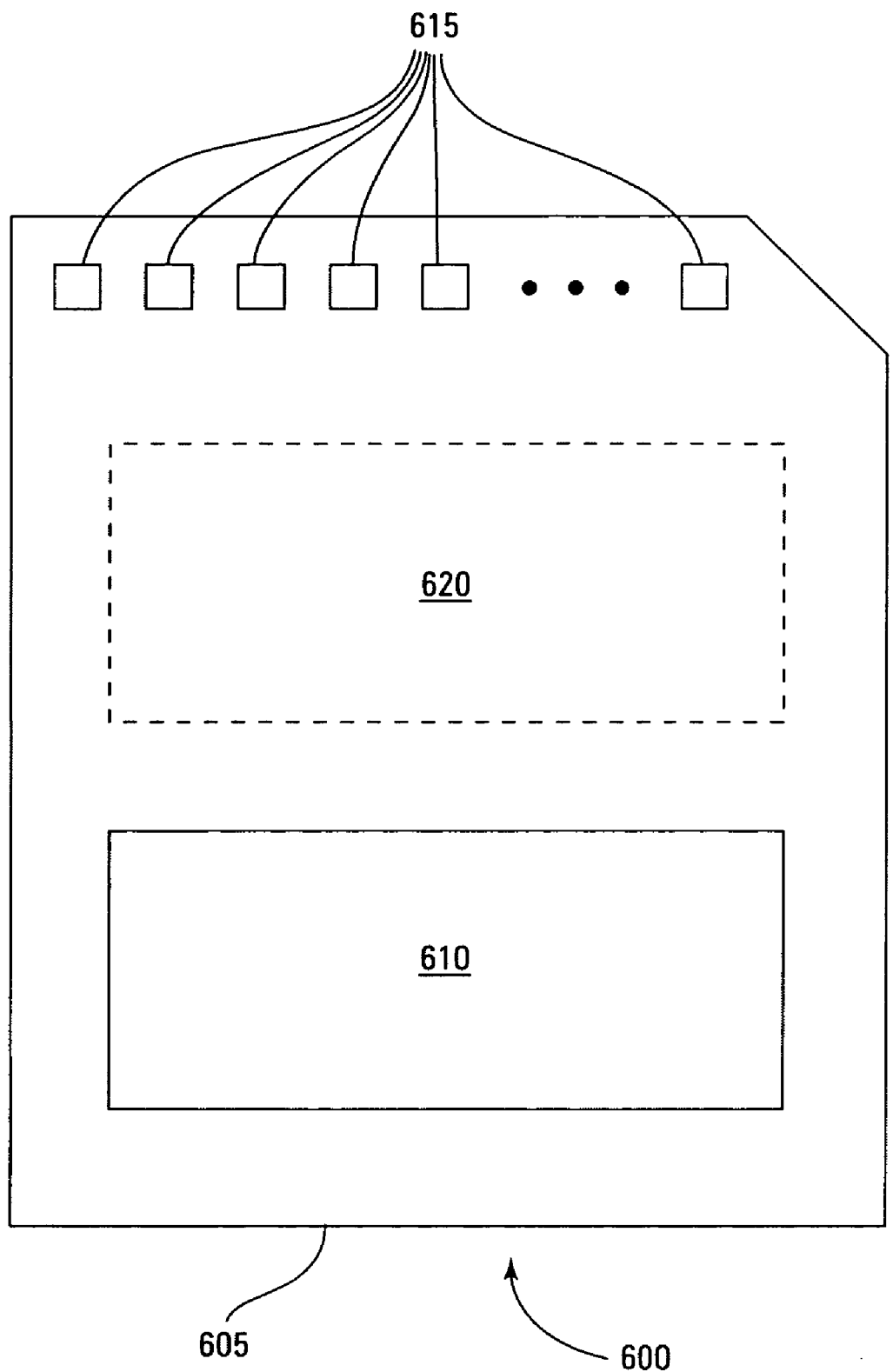
FIG. 6 shows a block diagram of one embodiment of a memory module of the present invention.

FIG. 6 is an illustration of one embodiment of a memory module 600 that incorporates the flash memory erase method of the present invention. Although memory module 600 is illustrated as a memory card, the concepts discussed with reference to memory module 600 are applicable to other types of removable or portable memory, e.g., USB flash drives. In addition, although one example form factor is depicted in FIG. 6, these concepts are applicable to other form factors as well.

Memory module 600 includes a housing 605 to enclose one or more memory devices 610. At least one memory device 610 is comprised of floating gate memory cells of the present invention. The housing 605 includes one or more contacts 615 for communication with a host device. Examples of host devices include digital cameras, digital recording and playback devices, PDAs, personal computers, memory card readers, interface hubs and the like. For some embodiment, the contacts 615 are in the form of a standardized interface. For example, with a USB flash drive, the contacts 615 might be in the form of a USB Type-A male connector. For some embodiments, the contacts 615 are in the form of a semi-proprietary interface, such as might be found on COMPACTFLASH™ memory cards licensed by SanDisk Corporation, MEMORYSTICK™ memory cards licensed by Sony Corporation, SD SECURE DIGITAL™ memory cards licensed by Toshiba Corporation and the like. In general, however, contacts 615 provide an interface for passing control, address and/or data signals between the memory module 600 and a host having compatible receptors for the contacts 615.

The memory module 600 may optionally include additional circuitry 620. For some embodiments, the additional circuitry 620 may include a memory controller for controlling access across multiple memory devices 610 and/or for providing a translation layer between an external host and a memory device 610. For example, there may not be a one-to-one correspondence between the number of contacts 615 and a number of I/O connections to the one or more memory devices 610. Thus, a memory controller could selectively couple an I/O connection (not shown in FIG. 6) of a memory device 610 to receive the appropriate signal at the appropriate I/O connection at the appropriate time or to provide the appropriate signal at the appropriate contact 615 at the appropriate time. Similarly, the communication protocol between a host and the memory module 100 may be different than what is required for access of a memory device 610. A memory controller could then translate the command sequences received from a host into the appropriate command sequences to achieve the desired access to the memory device 610. Such translation may further include changes in signal voltage levels in addition to command sequences.

The additional circuitry 620 may further include functionality unrelated to control of a memory device 610. The additional circuitry 620 may include circuitry to restrict read or write access to the memory module 600, such as password protection, biometrics or the like. The additional circuitry 620 may include circuitry to indicate a status of the memory module 600. For example, the additional circuitry 620 may include functionality to determine whether power is being supplied to the memory module 600 and whether the memory module 600 is currently being accessed, and to display an indication of its status, such as a solid light while powered and a flashing light while being accessed. The additional circuitry 620 may further include passive devices, such as decoupling capacitors to help regulate power requirements within the memory module 600.

CONCLUSION

In summary, an improved erase process of the present invention reduces the overerase stress experienced by flash memory cells. This increases the reliability and lifespan of the memory integrated circuit.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A method for erasing a flash memory device comprising a plurality of memory cells, the method comprising:
performing an erase operation on a subset of memory cells of the plurality of memory cells, the erase operation performed at a first erase voltage for a first erase time;
performing an erase verify operation on the subset of memory cells until the subset of memory cells is either erased or fails, a first erase verify operation starting at a first sensing time period that increases for each subsequent erase verify operation; and
if the erase verify operation passes at a final sensing time period, determining a final erase voltage and a final erase time in response to the final sensing time period.

2. The method of claim 1 wherein the subset of memory cells is a memory block.

3. The method of claim 2 wherein the first erase voltage is an array tub bias on each memory cell of the memory block.

4. The method of claim 1 wherein the final sensing time period determines a threshold voltage indicating an erase condition.

5. The method of claim 4 wherein the threshold voltage determines the final erase voltage and the final erase time.

6. The method of claim 1 and further including performing an erase operation with the final erase voltage for the final erase time.

7. The method of claim 1 wherein the flash memory device is a NAND flash memory device.

8. A method for erasing a NAND flash memory block comprising an array of memory cells, the method comprising:
performing an erase operation on the flash memory block, the erase operation performed at a first erase voltage for a first erase time;
performing an erase verify operation on the flash memory block that repeats until each memory cell of the flash memory block has a passing threshold voltage, a first erase verify operation starting at a first sensing time period that increases a predetermined time for each subsequent erase verify operation;
determining a final erase voltage and a final erase time in response to the passing threshold voltage; and
performing an erase operation on the flash memory block at the final erase voltage for the final erase time.

9. The method of claim 8 wherein the first sensing time period is three microseconds that increases to a maximum of fifty microseconds.

10. The method of claim 9 wherein the passing threshold voltage starts at −1.5 V corresponding to the three microsecond first sensing time period and increases to a threshold voltage of −0.5 V corresponding to the fifty microsecond first sensing time period.

11. A method for erasing a flash memory device comprising a plurality of memory cells, the method comprising:
performing an erase operation on a subset of memory cells of the plurality of memory cells, the erase operation performed at a first erase voltage for a first erase time;
performing an erase verify operation on the subset of memory cells until the subset of memory cells is either erased or a predetermined quantity of erase verify operations have been performed, a first erase verify operation starting at a first sensing time period that increases for each subsequent erase verify operation;
if the erase verify operation passes at a final sensing time period, determining a final erase voltage and a final erase time in response to the final sensing time period; and
if the predetermined quantity of erase verify operations have been performed, increasing the first erase voltage by a predetermined voltage and performing the erase verify operations until the subset of memory cells is either erased or the predetermined quantity of erase verify operations have been performed.

12. The method of claim 11 wherein the predetermined voltage is 1.0 V.

13. The method of claim 11 and further including:
performing an erase operation at the final erase voltage for the final erase time; and
performing an erase verify operation for the first sensing time.

14. A flash memory device comprising:
a memory array having a plurality of memory blocks that are each comprised of a plurality of memory cells arranged in rows and columns; and
control circuitry that is adapted to execute a memory erase and verify method comprising performing an erase operation on a subset of memory cells of the plurality of memory cells, the erase operation performed at a first erase voltage for a first erase time, performing an erase verify operation on the subset of memory cells until the subset of memory cells is either erased or fails, a first erase verify operation starting at a first sensing time period that increases for each subsequent erase verify operation, and if the erase verify operation passes at a final sensing time period, determining a final erase voltage and a final erase time in response to the final sensing time period.

15. The device of claim 14 and further including a sense amplifier coupled to the memory array for sensing memory cell current for each of the sensing time periods.

16. The device of claim 14 wherein the memory array is coupled in a NAND architecture.

17. The flash memory device of claim 14 wherein the memory array is arranged in a NOR architecture.

18. A memory system comprising:
a processor that generates control signals; and a flash memory device, coupled to the processor, that accepts the control signals, the device comprising:
an array of memory cells arranged a plurality of memory blocks, each memory block having a plurality of memory cells that are arranged in rows and columns such that the rows are coupled with word lines and the columns are coupled with bit lines; and
control circuitry that is adapted to execute a memory erase and verify method comprising performing an erase operation on a subset of memory cells of the plurality of memory cells, the erase operation performed at a first erase voltage for a first erase time, performing an erase verify operation on the subset of memory cells until the subset of memory cells is either erased or fails, a first erase verify operation starting at a first sensing time period that increases for each subsequent erase verify operation, and if the erase verify operation passes at a final sensing time period, determining a final erase voltage and a final erase time in response to the final sensing time period.

19. The system of claim 18 wherein the control circuit is a state machine.

20. A memory module comprising:
a memory array arranged in rows and columns such that the rows comprise word lines coupled to control gates of a plurality of memory cells and the columns comprise bit lines coupled to series strings of memory cells, the memory array further arranged in memory blocks; and
control circuitry that is adapted to execute a memory erase and verify method comprising performing an erase operation on a subset of memory cells of the plurality of memory cells, the erase operation performed at a first erase voltage for a first erase time, performing an erase verify operation on the subset of memory cells until the subset of memory cells is either erased or fails, a first erase verify operation starting at a first sensing time period that increases for each subsequent erase verify operation, and if the erase verify operation passes at a final sensing time period, determining a final erase voltage and a final erase time in response to the final sensing time period; and
a plurality of contacts configured to provide selective contact between the memory array and a host system.

21. The module of claim 20 and further including a memory controller coupled to the memory array for controlling operation of the memory device in response to the host system.

22. A method for erasing a flash memory device comprising a plurality of memory cells, the method comprising:
performing an erase operation on a subset of memory cells of the plurality of memory cells, the erase operation performed at a first erase voltage for a first erase time;
performing an erase verify operation on the subset of memory cells until the subset of memory cells is either erased or a maximum quantity of erase verify operations have been performed, a first erase verify operation starting at a first sensing time period that increases for each subsequent erase verify operation;
if the erase verify operation passes at a final sensing time period, determining a final erase voltage and a final erase time in response to the final sensing time period; and
if the maximum quantity of erase verify operations have been performed, increasing a last used erase voltage by a constant voltage, increasing a last used erase time by a constant time period, and repeating the erase verify operations with the increased erase voltage and erase time until the subset of memory cells is either erased or the maximum quantity of erase verify operations have been performed.

* * * * *